(12) United States Patent
Gunther et al.

(10) Patent No.: US 6,989,551 B2
(45) Date of Patent: Jan. 24, 2006

(54) TEST STRUCTURE FOR DETERMINING A MINIMUM TUNNEL OPENING SIZE IN A NON-VOLATILE MEMORY

(75) Inventors: Allen Gunther, Hillsboro, OR (US); Lei Chen, Portland, OR (US); Mao Du, Portland, OR (US); Mike Rowlandson, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 663 days.

(21) Appl. No.: 10/053,004

(22) Filed: Nov. 2, 2001

(65) Prior Publication Data

US 2003/0085727 A1    May 8, 2003

(51) Int. Cl.
*H01L 23/58* (2006.01)
(52) U.S. Cl. ........................................... 257/48
(58) Field of Classification Search ............... 714/718, 714/724; 257/315, 317, 318, 321, 48; 365/185.01, 365/185.05, 185.28, 185.29; 438/264
See application file for complete search history.

(56) References Cited

U.S. PATENT DOCUMENTS

| 4,924,278 | A |   | 5/1990  | Logie ........................... 257/318 |
|-----------|---|---|---------|------------------------------------------|
| 5,273,923 | A | * | 12/1993 | Chang et al. ................ 438/264    |
| 5,323,039 | A | * | 6/1994  | Asano et al. ................ 257/315    |
| 6,172,392 | B1|   | 1/2001  | Schmidt et al. ............. 257/315     |
| 6,208,559 | B1|   | 3/2001  | Tu et al. ................ 365/185.18    |

\* cited by examiner

*Primary Examiner*—Albert Decady
*Assistant Examiner*—James C. Kerveros

(57) ABSTRACT

In one embodiment of the invention, a test structure for testing the sufficiency of tunnel opening sizes in a non-volatile memory cell includes N write paths aligned substantially in parallel, each of the write paths beings individually programmable and M floating gates, each of the floating gates overlapping each of the multiple write paths to form a N column-by-M row array of Intersecting areas. An N column-by-M row array of tunnel openings is formed in the intersecting areas and between the floating gates and write paths, with the tunnel openings in each array column being of a same size and the tunnel openings in each array row being of different sizes. A read path coupled to the M floating gates is operable to detect a programmed write path if the tunnel openings formed over the programmed write path are of sufficient size to successfully couple the M floating gates to the programmed write path.

6 Claims, 7 Drawing Sheets

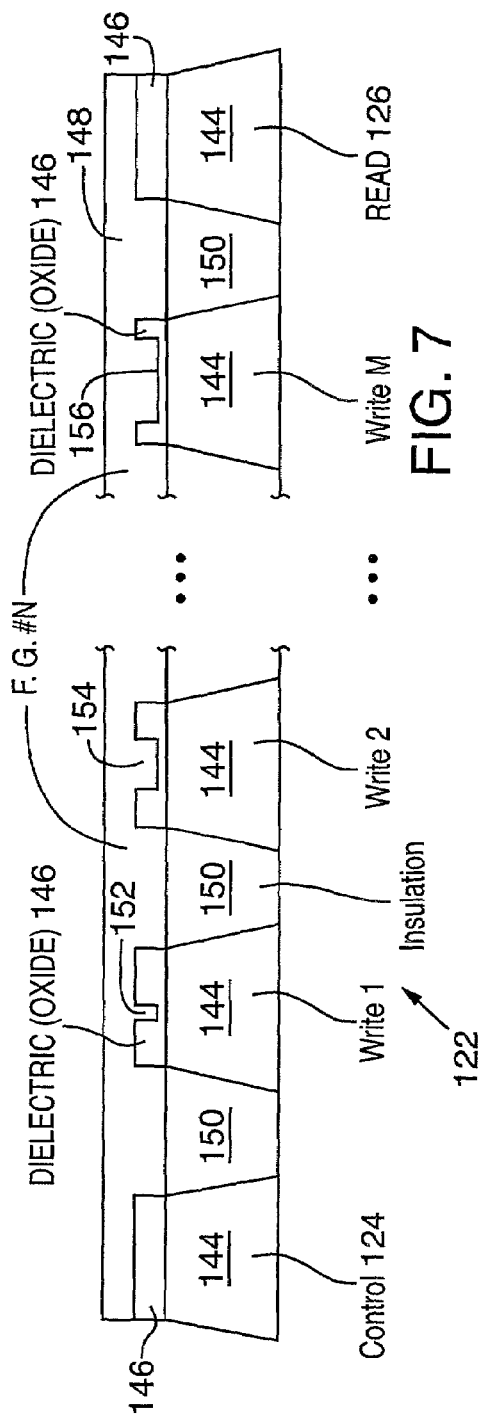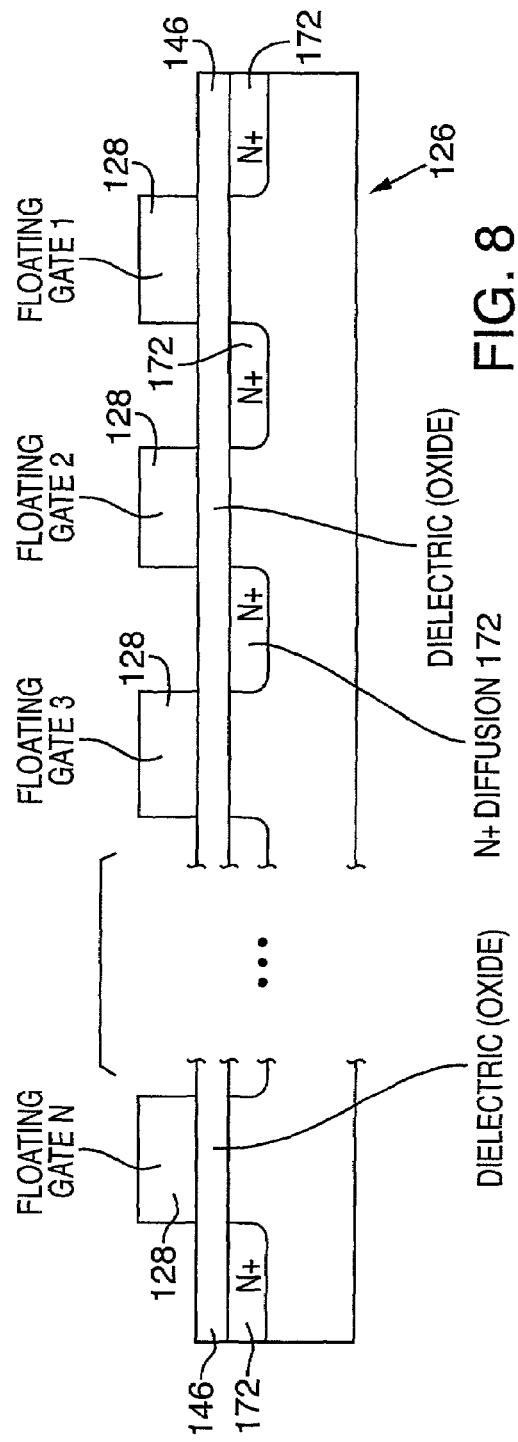

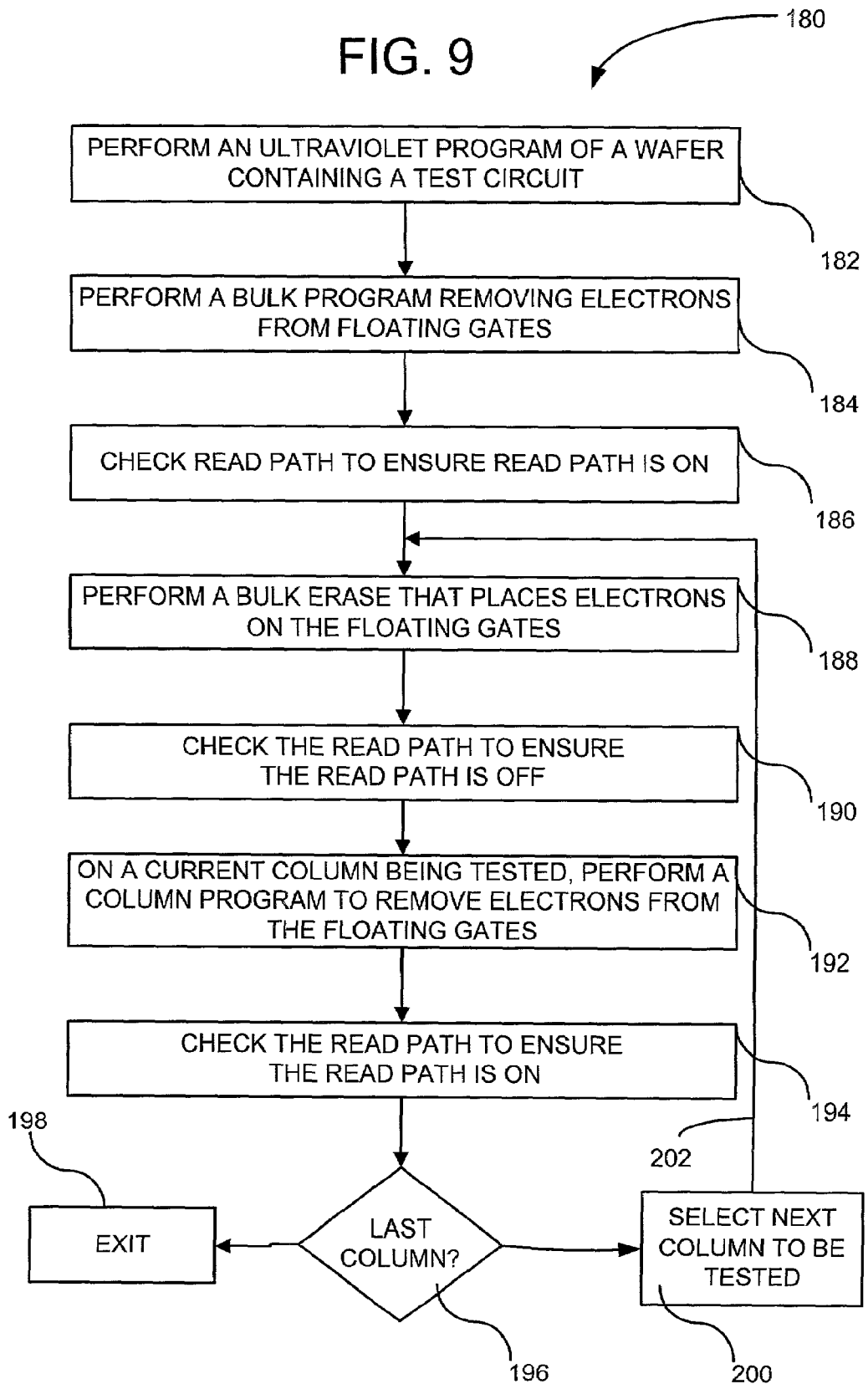

TEST STRUCTURE FOR DETERMINING A MINIMUM TUNNEL OPENING SIZE IN A NON-VOLATILE MEMORY

TECHNICAL FIELD

The invention relates to non-volatile memory and, more particularly, to a test structure and method for determining the minimum tunnel opening size and defect density in non-volatile memory cells.

BACKGROUND

Non-volatile memory devices, such as EPROM, EEPROM, and Flash EEPROM, store data even after power is turned off. One common application of EEPROMs is in programmable logic devices (PLDs). PLDs are standard semiconductor components purchased by systems manufacturers in a "blank" state that can be custom configured into a virtually unlimited number of specific logic functions. PLDs provide system designers with the ability to quickly create custom logic functions to provide product differentiation without sacrificing rapid time to market. PLDs may be reprogrammable, meaning that the logic configuration can be modified after the initial programming.

The manufacturing of PLDs has moved progressively toward defining smaller device features, characterized by the channel length of transistors. As feature sizes shrink, the conventional EEPROM structure has given way to different cell designs and array architectures, all intended to increase density and reliability in the resulting circuit. In most cases, cell designers strive for designs which are reliable, scalable, cost effective to manufacture and able to operate at lower power, in order for manufacturers to compete in the semiconductor industry.

Typically, in programmable logic EEPROM devices, in order to store a logical zero, electrons are injected onto a floating gate of a transistor to provide a negative voltage on the floating gate, thus increasing the control gate threshold voltage needed to turn on the transistor. This is done by causing electrons to tunnel through a tunnel oxide layer, or "tunnel opening," to the floating gate. Conversely, to store a logical one, the floating gate is discharged and the threshold voltage is decreased by causing electrons on the floating gate to tunnel through the tunnel opening in the opposite direction.

One example of a commercially successful EEPROM structure for programmable logic applications is shown in U.S. Pat. No. 4,924,278 (hereinafter "the '278 patent"), issued to Stewart Logie on May 8, 1990 and assigned to Advanced Micro Devices, Inc., Sunnyvale, Calif.

FIGS. 1 and 2 show a schematic diagram and a cross-section, respectively, of one embodiment of the EEPROM structure shown in the '278 patent. The EEPROM structure uses a single layer of polycrystalline silicon and a control gate formed in the silicon substrate to eliminate the need to form a separate control gate and floating gate in layers of poly silicon. The EEPROM structure is made up of three separate NMOS transistors: a write transistor, a read transistor, and a sense transistor. In order to "program" the floating gate of the sense transistor, a net positive charge is placed on the gate by causing free electrons from the floating gate to tunnel into the source region of the write transistor through the tunnel opening. Likewise, to erase the floating gate, the floating gate is given a net negative charge by causing electrons to tunnel from the source region onto the floating gate through the tunnel opening.

FIG. 2 shows a standard EEPROM memory cell 10. A P-type substrate 5 has N+ type regions formed on and below its surface by standard diffusion techniques. These N+ type regions correspond to the source and drain regions of the three transistors that make up the EEPROM memory circuit. Write transistor 20 comprises drain 22, source 24, channel region 25, gate oxide layer 27 and control gate 28. Sense transistor 30 comprises drain 32, source 34, channel region 35, gate oxide layer 37, and N-type polycrystalline silicon (poly-Si) floating gate 38. Read transistor 40 comprises drain 41, source 32, which is also the drain of sense transistor 30, channel region 45, gate oxide layer 47, and control gate 48. Poly-Si floating gate 38 is capacitively coupled to source 34 of sense transistor 30, via gate oxide layer 37 (approximately 300 .ANG. in thickness), and capacitively coupled to source 24 of write transistor 20 via tunnel oxide layer 55 (approximately 90 .ANG. in thickness). Poly-Si floating gate 38 also extends over channel region 35 of sense transistor 30 so that when a sufficient positive charge is on poly-Si floating gate 38, channel 35 will invert and conduct current between source 34 and drain 32 of sense transistor 30. Field oxide layer 57 insulates floating gate 38 from the underlying substrate 5 separating sense transistor 30 and write transistor 20.

Operation of the memory cell 10 will be described with reference to FIGS. 1 and 2. In FIG. 1 word line WL is connected to control gates 28 and 48 of write transistor 20 and read transistor 40, respectively. Tunnel oxide layer 55 (the tunnel opening) is represented by capacitor $C_t$ while gate oxide layer 37 between source 34 of sense transistor 30 and poly-Si floating gate 38 is represented by capacitor $C_g$. Drain and source contacts are represented by D and S, respectively.

The three operations of the memory circuit are write, erase, and read. The various voltages applied to the circuit of FIG. 3 are shown in Table 1.

TABLE 1

| | WL | Write | Read | Source | Substrate | Control | WLR |
|---|---|---|---|---|---|---|---|
| Read | $V_{cc}$ | ground | $V_{sense}$ | ground | ground | ground | $V_{cc}$ |
| Program | $V_{pp}$ | $V_{pp}$ | HiZ | ground | ground | ground | ground |
| Erase | $V_{pp}$ | ground | HiZ | $V_{pp}$ | ground | $V_{pp}$ | $V_{cc}$ |

When N type poly-Si floating gate 38 is written upon, or programmed, floating gate 38 is given a positive charge by removing free electrons from floating gate 38. To accomplish this, first, a high programming voltage $V_{pp}$ is applied to word line WL, which turns on write and read transistors 20 and 40. By turning on transistor 20, a write signal applied to drain 22 of write transistor 20 is coupled to source 24. Similarly, when transistor 40 is on, a read signal applied to drain 41 of read transistor 40 is coupled to source 32 of read transistor 40. Next, in order to program sense transistor 30, high programming voltage $V_{pp}$ is applied to drain 22 of write transistor 20, while source 34 of sense transistor 30, as well as drain 41 of read transistor 40 and substrate 5, are grounded. Because source 24 of write transistor 20 is at a high voltage and source 34 of sense transistor 30 is grounded, voltage is capacitively coupled to poly-Si floating gate 38 due to the electric field created between source 24 and source 34 through gate oxide layer 37 and tunnel oxide layer 55.

Because the capacitance between source 24 and floating gate 38 across tunnel oxide layer 55 is very small (on the order of 0.004 pF), and the capacitance between source 34 and floating gate 38 across gate oxide layer 37 is about ten times greater, a large percentage (on the order of 90%) of the voltage difference between source 24 and source 34 (i.e., $V_{pp}$) appears between source 24 and floating gate 38 across tunnel oxide layer 55. This voltage is sufficient to cause electron tunneling from floating gate 38 to source 24 of write transistor 20 through tunnel oxide layer 55, resulting in a net positive charge on floating gate 38. The positive charge is sufficient to turn on sense transistor 30 because floating gate 38 extends over channel region 35 of sense transistor 30. This indicates a logical 1 since current can flow through sense transistor 30 during a read operation.

To erase floating gate 38, high programming voltage $V_{pp}$ is applied to word line WL as well as source 34 of sense transistor 30 and drain 41 of read transistor 40, while drain 22 of write transistor 20 and substrate 5 are grounded. In this biasing arrangement, the high voltage at source 34 of sense transistor 30 is capacitively coupled to floating gate 38 and almost all of high programming voltage $V_{pp}$ appears across tunnel oxide layer 55 between floating gate 38 and grounded source 24. This causes electrons from source 24 to tunnel through tunnel oxide layer 55, resulting in a net negative charge on floating gate 38. Thus, channel 35 of sense transistor 30 is not inverted and sense transistor 30 is shut off.

The size (i.e., area) of the tunnel opening is obviously important to ensure proper operation of the memory cell 10. However, the size of the tunnel opening is also an important factor in the determining the overall size of the memory cell. If the tunnel opening size can be reduced while maintaining low defects and proper operation, then the overall memory cell can also be reduced. Reducing the size of a memory cell adds up to significant savings in chip real estate when multiplied by the millions of memory cells in a PLD.

FIG. 3 shows a graph of a curve representing yield versus tunnel opening size. A target point (shown at 60) is considered an ideal yield-versus-size tradeoff. As can be seen, the yield drops off significantly below the target point 60 as the tunnel opening size is further reduced. This drop off in yield is caused by limitations in non-linear optical systems used during fabrication. Conversely, tunnel opening sizes larger than the target point unnecessarily increase memory cell size without a corresponding increase in yield.

Unfortunately, there is no simple technique for determining the target point 60 of FIG. 3. For example, there is no standardized techniques for determining the smallest tunnel opening size in a memory cell for a given technology and no standardized techniques for determining the defect density for a given tunnel opening size.

SUMMARY

The invention is a test structure for determining the smallest acceptable tunnel opening size in a non-volatile memory cell. Additionally, defect density for one or more tunnel opening sizes may also be determined. As a result of using the test structure, smaller memory cells can be designed with knowledge that yield will be within acceptable limits.

In one aspect, the test structure has continuous strips of active area that are used to form a "control" path, a "read" path, and a "write" path. A dielectric layer is formed over the active strips. A one-dimensional array containing a number (N) of same-sized tunnel openings is formed on the write path. A layer of poly silicon is deposited over the dielectric and patterned into strips that are perpendicular to the active strips. The poly silicon strips are aligned with the tunnel openings and form a floating gate and sense device, which is capacitively coupled to external probe pads through the common "control" path.

In another aspect, the test structure may have a series of write paths wherein each write path has a one-dimensional array of "N" same-size tunnel openings. The first write path typically includes an array of tunnel openings with a relatively large size, with each additional write path containing an array of tunnel openings of incrementally descending size.

Whether there is one or multiple write paths, the test structure allows bulk (all N gates simultaneously) programming or erasing of any one-dimensional array of a tunnel opening size. For the embodiment with multiple write paths, the bulk programming and erasing of a tunnel opening size is independent of all other sizes through appropriate biasing of one write path with respect to all other write paths. Using the bulk programming and erasing, the tunnel opening sizes are tested in series one at a time. If any one of the tunnel openings in a one-dimensional array is closed (dielectric too thick in window), the read path will not conduct and the particular size associated with the one-dimensional array will fail.

In another aspect, the read path may be modified so that individual cells or groups of cells associated with a one-dimensional array can be analyzed for failure. By analyzing individual or groups of cells, a more accurate estimate of the defect density can be obtained.

In yet another aspect, the test structure may be applied to "stick cells" where the poly silicon size varies to ensure that the tunnel openings are larger than the poly silicon.

These and other aspects of the invention will become apparent from the following detailed description, which makes references to the accompanying drawings.

BRIEF DESCRIPTION OF THE DRAWINGS

FIG. 7 is a cross-sectional view of the test structure as seen through lines 7—7 of FIG. 6.

FIG. 8 is a cross-sectional view of the test structure as seen through lines 8—8 of FIG. 6.

FIG. 9 is a flowchart of a method for testing an N×M array of tunnel opening sizes, such as shown in the test structure of FIG. 6.

DETAILED DESCRIPTION

Figure 4:
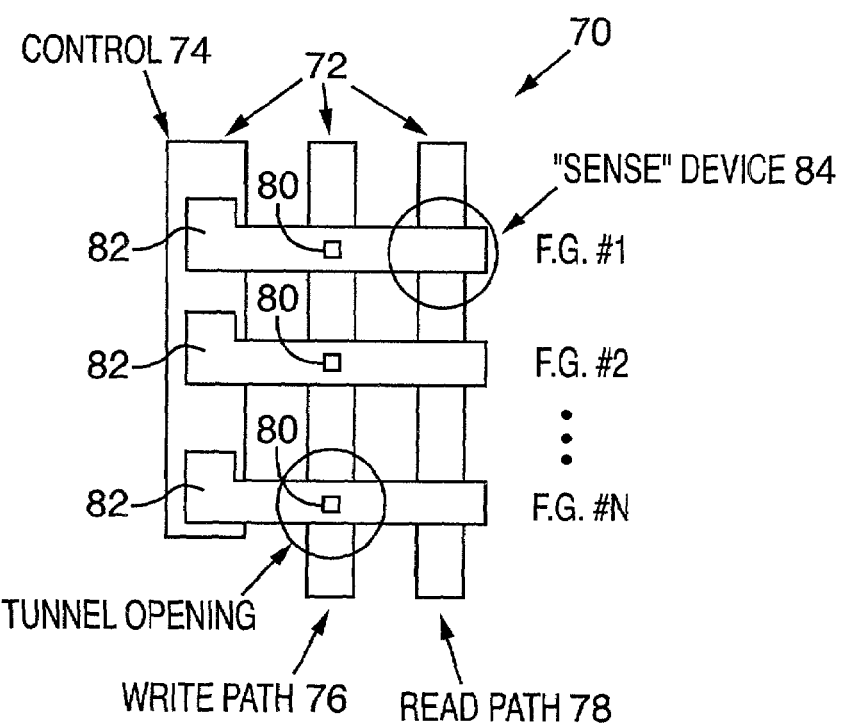
FIG. 4 shows a test structure in accordance with the invention with a single write path having a one-dimensional array of same size tunnel openings.

FIG. 4 shows a test circuit or structure 70 for testing whether a tunnel opening of a given size has an acceptable defect density. A plurality of continuous strips 72 are aligned in parallel and form a control path 74, a write path 76, and a read path 78. A dielectric (not shown) or oxide layer is formed over the continuous strips. A one-dimensional array or column of N same size tunnel openings 80 are formed in the write path 76, where N can be any number. A layer of poly silicon is deposited over the dielectric and patterned into strips 82 that are perpendicular to the continuous strips 72. Each strip 82 of poly silicon forms a floating gate (designated as F.G. #1-F.G. #N) and a sense device, such as sense device 84, that are associated with the tunnel openings 80. The floating gates 82 overlap with the write path 76 at an area of intersection. There is one tunnel opening within each area of intersection.

Typically, the test structure 70 is located on a test wafer (not shown), but it may also be used on a product wafer. External probe pads (not shown) on the wafer are used to apply appropriate voltage levels to the control, write, and read paths, as further described below.

The test structure 70 allows for bulk programming or erasing of the floating gates 1 through N. When the floating gates 82 are bulk erased, the control line 74 is placed at a potential $V_{pp}$ and the write path 76 is grounded. These voltage levels on the control path 74 and write path 76 draw electrons onto each of the floating gates 1 through N in parallel and simultaneously. To perform a bulk program, a voltage $V_{pp}$ is placed on the write path 76 while the control path 74 is grounded. These voltage levels draw electrons off of each of the floating gates 82 in parallel and simultaneously leaving a net positive charge on the floating gates. Thus, the write path is electrically coupled to the floating gates through the tunnel openings.

As further described below, the read path 78 includes an FET for each floating gate. The FETs in the read path 78 are coupled in series, such that if one of the FETs is not activated then the entire read path is not conducting. During testing, one end of the read path 78 may be coupled to a predetermined voltage level, such as 0.1 V, and the other end of the read path is grounded to detect whether all of the FETs are activated when the floating gates 1 through N are programmed. Additionally, the control path 74 is biased to a predetermined voltage. If any one of the tunnel openings 80 is defective, then the sense device associated with that defective tunnel opening will not conduct resulting in a failure.

The read path 78 may also be divided into smaller groups of sense devices (e.g., 2, 3, 4 . . . ) or the sense devices may be read on an individual basis. Reading the sense devices individually or in smaller groups provides more accurate defect density data, but also requires more hardware and external pads to test the structure 70. How the sense devices are read depends on the particular application and may vary.

Figure 5:
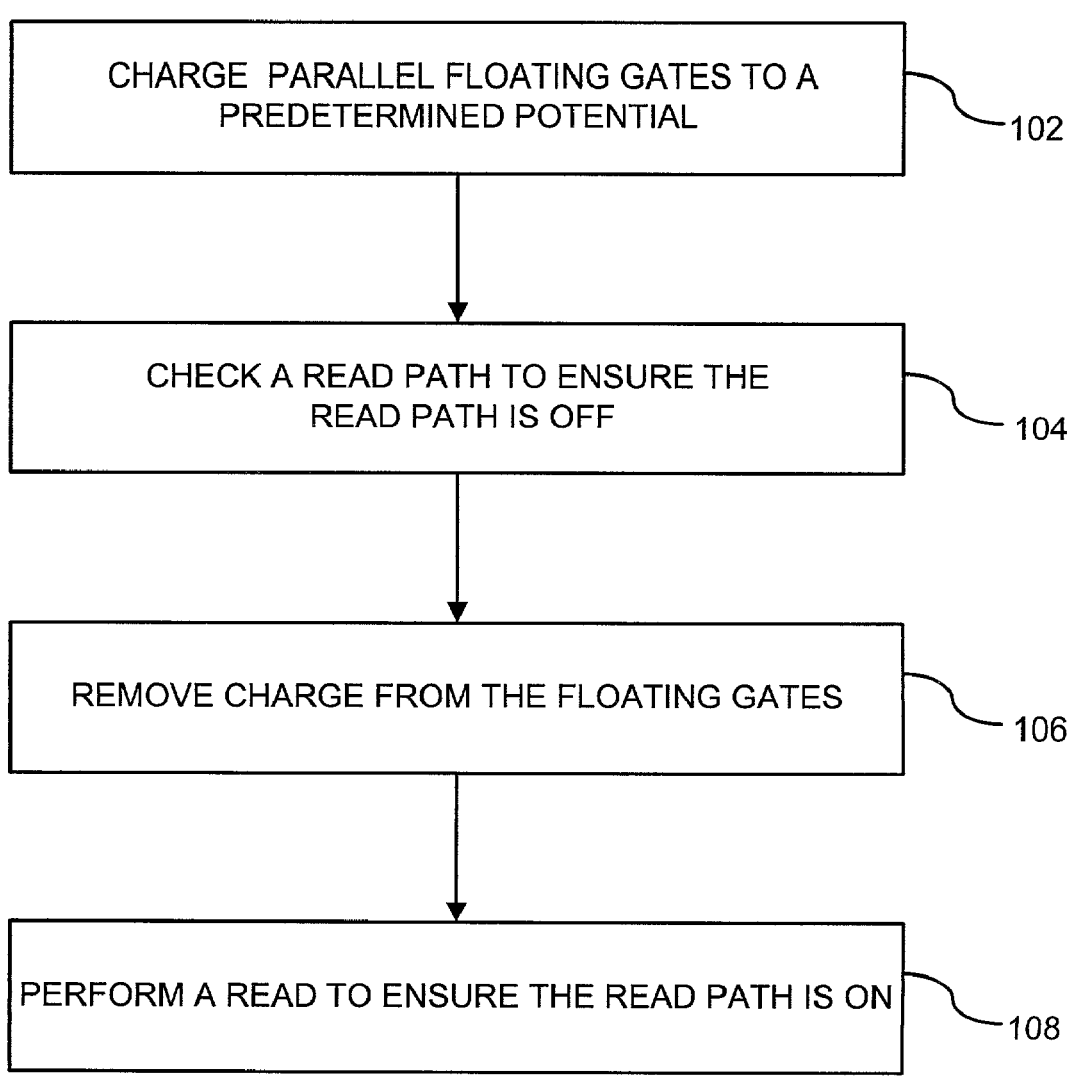
FIG. 5 is a flowchart of a method for testing a tunnel opening size using a test structure, such as the test structure of FIG. 4.

FIG. 5 shows a flowchart 100 of a method for testing tunnel openings, such as the tunnel openings 80 in the test structure 70 of FIG. 4. In process block 102, the parallel floating gates 82 are charged to a predetermined potential (i.e., bulk erase). This bulk erase is accomplished by having a voltage $V_{pp}$ on the control path 74 and the write path 76 grounded, thereby drawing electrons onto the floating gates 82 in parallel. In process block 104, the read path 78 is read or checked to ensure that it is OFF. That is, each properly operating sense device in the read path 78 is turned OFF with its corresponding floating gate negatively charged. The control path is biased to a predetermined voltage. To check or read the read path, one end of the read path 78 is biased to a predetermined voltage level and the opposing end of the read path is grounded to determine whether the read path is ON or OFF (floating). If any one of the sense devices is OFF, then the entire read path is not conducting and the read of the predetermined voltage level at one end of the read path fails. In this case, all of the floating gates 82 should be negatively charged thereby turning OFF their respective sense devices 84.

In process block 106, a bulk program is performed by removing charge from the floating gates 82 resulting in a net positive charge on the floating gates. This bulk program is accomplished by having a voltage $V_{pp}$ on the write line 76 with the control line 74 grounded. With these voltage levels on the control and write lines, electrons are removed from the floating gates. As a result, the sense devices, such as sense device 84, is turned ON or is activated. In process block 108, a read is again performed on the read path 78. If all of the sense devices are properly operating, they are activated and the entire read path 78 is conducting. A read at one end of the read path 78 will then detect certain current flow in the read path.

Thus, using the test structure 70 of FIG. 4, a determination can be made whether the size of the tunnel opening in the one-dimensional array is large enough that a sufficient number of the floating gates can be properly programmed and erased. If any one of the N tunnel openings is defective, the read path will not conduct and a failure will be indicated.

If more elaborate detection means are used to read smaller groups of the sense devices or individual sense devices, a more accurate defect density can be obtained. The defect density can be defined for a given tunnel opening size in terms of the percentage of failed sense devices. A tunnel opening size is sufficiently large if the defect density satisfies a predetermined minimum requirement to be decided based on the particular application.

Figure 6:
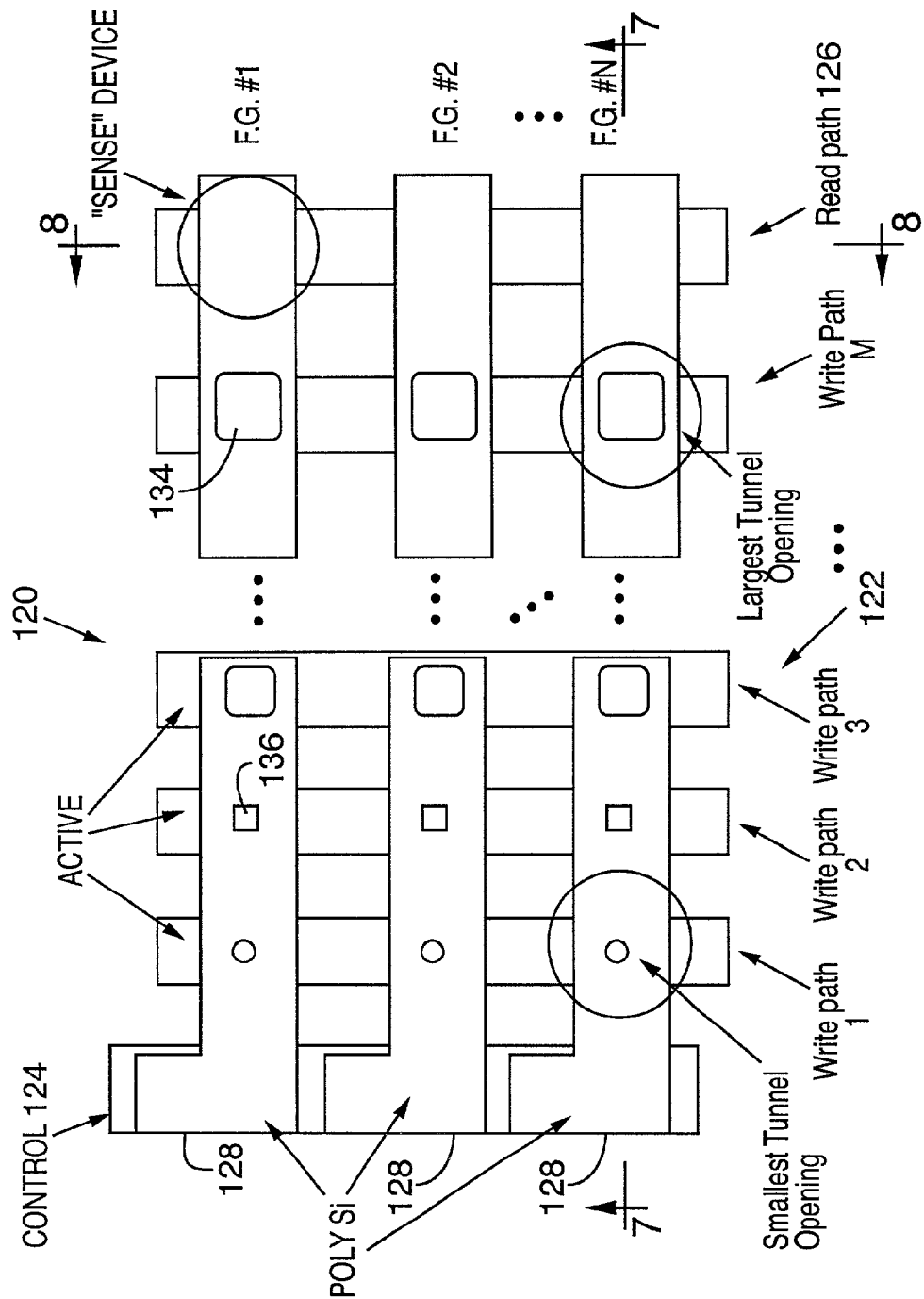
FIG. 6 shows another embodiment of a test structure having an N×M array of tunnel openings.

FIG. 6 shows a test structure 120 similar to that of FIG. 4, but with M write paths 122 positioned in parallel, where M can be any desired number. Each of the write paths is a continuous strip of active area to allow bulk programming and erasing of floating gates in the test structure. The test structure 120 also includes continuous strips of active area forming a control path 124, to control the programming and erasure of the floating gates, and a read path 126 to read whether the floating gates are properly programmed or erased. A dielectric layer (not shown) is formed over the active strips. In each of the write paths 122, a one-dimensional array or column of N same size tunnel openings is formed. Thus, each of these tunnel opening sizes in a one-dimensional array are designed to be geometrically equivalent in size. Because there are M write paths, the test structure 120 has a two-dimensional array N×M of tunnel openings. The write paths have different tunnel opening sizes. For example, write path 1 has the smallest tunnel opening size, write path 2 has a slightly larger tunnel opening, and each successive write path has an incrementally larger tunnel opening size ending with the largest tunnel opening size in write path M.

A layer of poly silicon is deposited over the dielectric and patterned into strips, which are perpendicular to the active strips such that one strip of poly silicon is aligned to a set of tunnel openings containing varying sizes. The strips of poly silicon form floating gates, shown generally at 128, such that N floating gates are aligned in parallel. Each floating gate is aligned over the read path 126, to form a sense device, such as sense device 130.

The larger tunnel openings are shown generically by larger geometric shapes. For example, tunnel opening 134 is shown as larger than tunnel opening 136. Although the array of tunnel openings are shown as continuously growing in size from left to right, this pattern can easily be varied. For example, multiple write paths can have geometrically equivalent tunnel opening sizes. Also, the tunnel opening sizes can be varied, such as alternating between larger and smaller.

FIG. 7 shows a cross-sectional view of the test structure 120 as seen through line 7—7 of FIG. 6. The test structure 120 includes the multiple write paths 122, including write paths 1 through M. The control path 124 and read path 126 are positioned on opposing sides of the write paths 122. The control path 124, write path 122, and read path 126, all have an active area, or diffusion area 144. A dielectric or oxide layer 146 is formed over the active areas 144. A layer of poly silicon 148 is deposited over the oxide layer 146 to form the floating gate (labeled in FIG. 6 as F.G.#N). Insulation 150 is positioned between the active areas to electrically isolate the active areas from each other. The insulation may be a shallow trench isolation, or a field oxide isolation. Using optical instrumentation, a tunnel opening or window is formed in each of the write paths as shown at 152, 154, and 156. As can readily be seen from FIG. 7, the tunnel opening 152 is the smallest tunnel opening, and the tunnel openings become progressively larger until the largest tunnel opening 156. Those skilled in the art will readily understand that different size tunnel openings can be organized in the test structure 120 in any desired fashion. For example, instead of getting progressively larger, the tunnel openings can be progressively smaller. Additionally, any number of tunnel openings can be the same size and the tunnel openings can vary in size in any desired pattern.

The tunnel openings have a thinner oxide layer, so that under proper voltage levels, electrons from the poly silicon 148 can pass through the oxide layer 146 to and from the poly silicon floating gate 148. Notably, the control path 124 and the read path 126 do not have such tunnel openings.

FIG. 8 shows a cross-sectional view of the read path 126 as seen through the line 8—8 in FIG. 6. The active area 144 of the read path 126 is a P-type substrate, having a series of N+ diffusions 172 on opposite sides of the floating gates 128. Thus, the read path 126 forms a series of FETs that are ON or OFF, depending on the charge on the floating gate and voltage on the control path. If the floating gate is negatively charged, then the FET is OFF and no current can flow through read path 126. Conversely, if all of the floating gates are programmed such that net positive charge is placed on the floating gates, then each of the FETs will be activated and current can flow through the read path.

FIG. 9 shows a flowchart 180 of a method for testing the test structure 120 of FIGS. 6–8. One goal of the method is to test each of the write paths 122 individually. As a result, each one-dimensional array of tunnel openings associated with a write path is tested simultaneously (i.e., in parallel). The write path with the largest tunnel openings (i.e., write path M) is tested first to ensure the test structure is operating properly (the largest tunnel opening is selected such that it should always pass.) After that, each of the write paths are tested individually and with smaller and smaller tunnel opening sizes until there is a failure.

Figure 1:
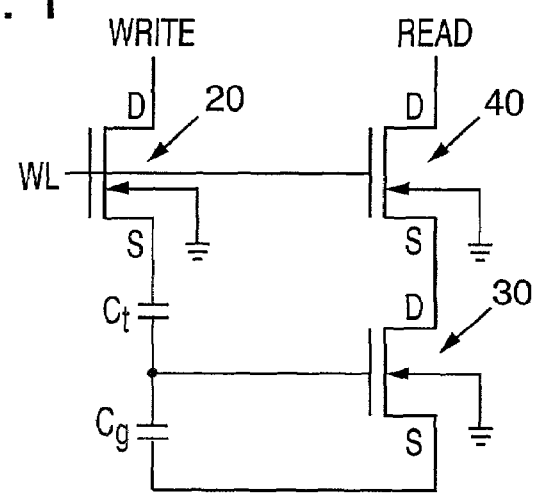
FIG. 1 is a schematic diagram of a prior art EEPROM cell used in a programmable logic device.
Figure 2:
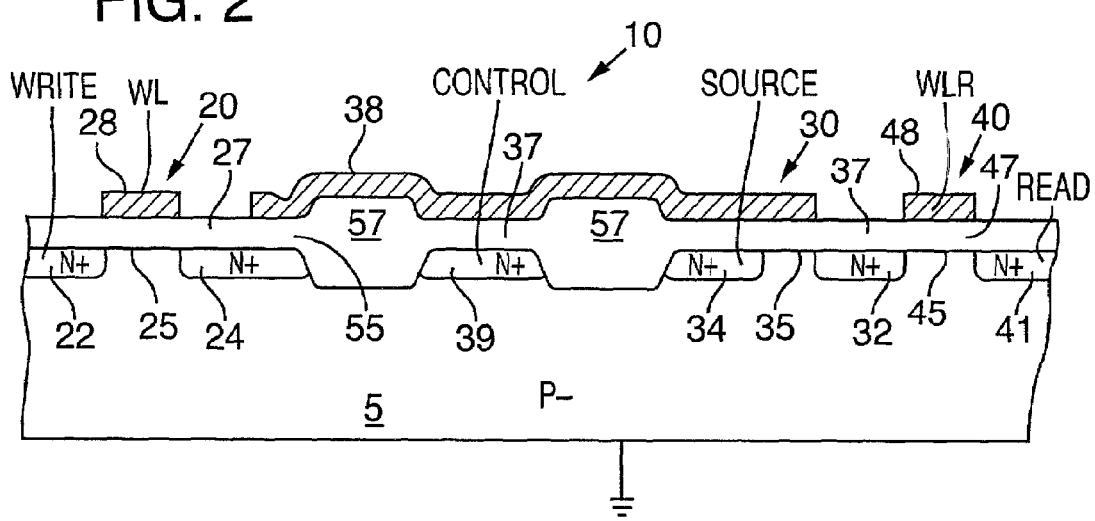
FIG. 2 is a cross-sectional view of the EEPROM cell shown in FIG. 1.
Figure 3:
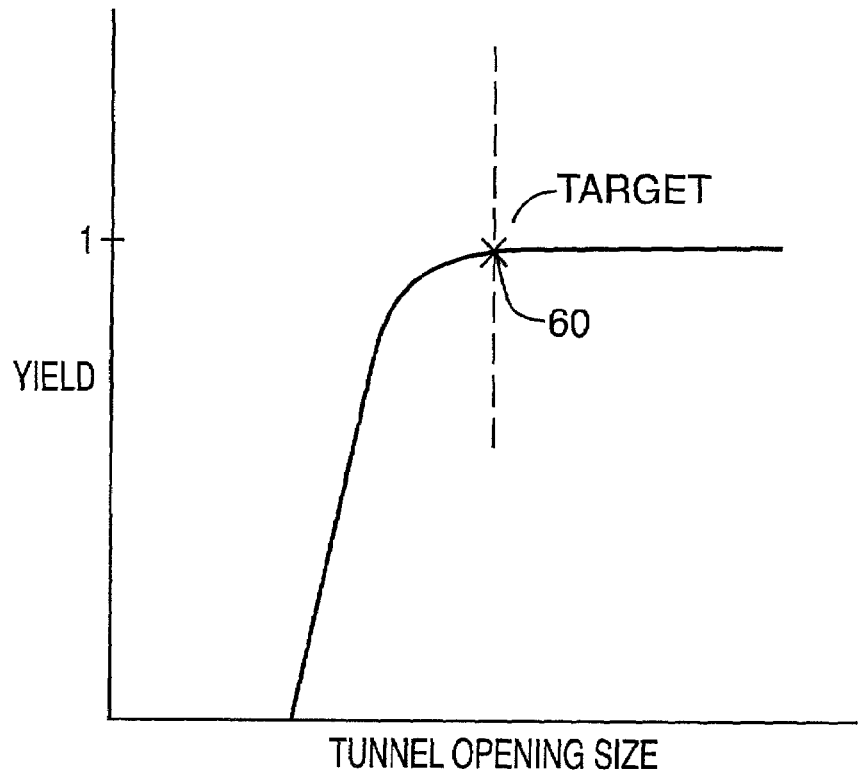
FIG. 3 is a graph showing yield versus tunnel opening size.

In process block 182, the wafer containing the test structure 120 is programmed using an ultra-violet light source. By performing the ultra-violet program, electrons are removed from the floating gates 128 of the test structure. In process block 184, a bulk program is performed to further ensure that the electrons are removed from the floating gates. To accomplish the bulk program, the voltage levels on the write paths 122 are set to $V_{pp}$ and the control line 124 is grounded. As a result, any electrons that are on the floating gates 128 pass through the tunnel openings (such as tunnel openings 152, 154, 156 of FIG. 7). In process block 186, the read path 126 is checked to ensure that the read path is ON. Specifically, with reference to FIG. 8, with each of the floating gates 128 being programmed, the FETs within the read path 126 are all activated or ON thereby allowing current to flow through the read path. One end of the read path has a predetermined voltage on it, such as 0.1V, and the other end of the read path is grounded to detect whether current can flow through the read path. In process block 188, a bulk erase is performed that places electrons on the floating gates. The bulk erase is performed by setting all of the write paths 122 to ground and the control path 124 to $V_{pp}$. As a result of these voltage levels, electrons pass from the write path 122 through the tunnel openings (e.g., 152, 154, 156) and on to the floating gates 128. In process block 190, the read path 126 is checked to ensure that the read path is OFF. That is, with electrons on the floating gates 128, each of the FETs in the read path should be OFF. In process block 192, a single write path or column is programmed to remove electrons from the floating gates. The column that is programmed is a current column being tested. The test starts with the largest tunnel opening size on the write path M, to ensure that the test procedure is set up properly since this tunnel opening is made large enough that any failures are likely attributable to the test set-up itself. To perform the column program, all the unselected write lines are tied to the control line 124 or to some intermediate voltage level. The control path 124 is grounded while the currently selected write path (in this case write path M) is set to $V_{pp}$. By setting the voltage levels in this way, only the currently selected write path is used to remove the electrons from the floating gates. In process block 194, the read path is again checked to ensure that the read path is ON and conducting current. In decision block 196, a check is made whether the last column has been tested. If all the columns have been tested, the procedure ends at process block 198. Otherwise, the next column to be tested is selected (process block 200) and another iteration of the procedure starts over again as shown by arrow 202. A single column erase may also be done to ensure that the electrons flow through the tunnel openings in both directions. Smaller and smaller tunnel openings are tested until there is a failure. Thus, the smallest tunnel size previous to the failure should be the target point 60 from FIG. 3.

Figure 10:
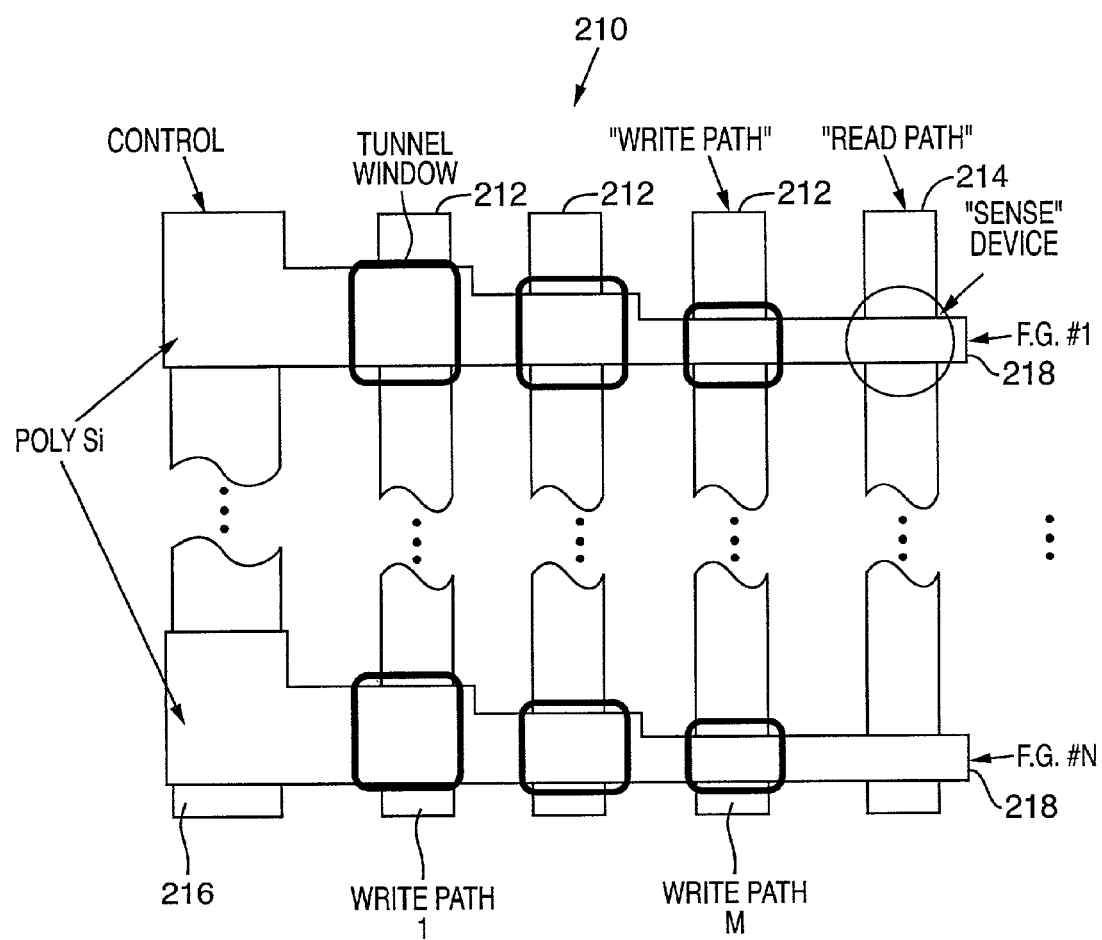
FIG. 10 shows yet another embodiment of a test structure having "stick cell" type memory cells.

FIG. 10 shows a similar structure to that of FIG. 6, but for a stick cell type structure 210. As in FIG. 6, the structure includes multiple write paths 212, a read path 214, and a control path 216. In the stick cell structure 210, it is desirable to have the tunnel opening slightly larger than the floating gates. As a result, the floating gates 218 are staircased so that the poly silicon gate is at its thinnest on write path M and at its thickest on the control path 216. Thus, the stick cell configuration differs from the "stop-sign" configuration of FIG. 6, in that in the stick cell the tunnel opening overlaps both floating gate and the active edges. This leads to a tunnel window with a field edge (or STI edge for shallow trench isolation) and a poly-edge. The common floating gate shared by the different write paths is graduated in such a way that the tunnel openings overlap (for the poly-edge of the floating gate and the active edge of the write path) remains constant by the topographical design rules for the process. In contrast, in the stop sign cell, the tunnel windows overlapped the poly silicon of the floating gate. In other respects, the stick cell can be tested similar to that already described in reference to the stop sign cells.

Having illustrated and described the principles of the illustrated embodiments, it will be apparent to those skilled in the art that the embodiments can be modified in arrangement and detail without departing from such principles.

Those skilled in the art will recognize that any desired tunnel size openings may be used. Example tunnel size openings include 0.3, 0.35, 0.4, 0.45, 0.5, 0.55, 0.6 um for 0.25 micron technology.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. A test structure for testing the sufficiency of tunnel opening sizes in a non-volatile memory cell, comprising:
   multiple individually programmable write paths aligned substantially in parallel;
   multiple floating gates aligned substantially in parallel and aligned substantially perpendicularly to the multiple write paths, the floating gates overlapping the multiple write paths to form an array of intersecting areas;
   an array of tunnel openings formed in the intersecting areas and between the floating gates and write paths, with the tunnel openings formed over a same write path being of substantially a same size and with the tunnel openings farmed over different write paths being of different sizes; and
   a read path coupled to the floating gates and operable to detect a programmed write path if the tunnel openings formed over the programmed write path are of sufficient size to successfully couple the floating gates to the programmed write path.

2. The test structure of claim 1, including a control path operable to program and erase the floating gates in parallel.

3. The test structure of claim 1, wherein the read path is coupled to all of the floating gates.

4. The test structure of claim 1, wherein the test structure is located on a semiconductor wafer.

5. A test structure for testing the sufficiency of tunnel opening sizes in a non-volatile memory cell, comprising:
   N write paths aligned substantially in parallel, each of the write paths beings individually programmable;
   M floating gates, each of the floating gates overlapping each of the multiple write paths to form a N column-by-M row array of intersecting areas;
   an N column-by-M row array of tunnel openings formed in the intersecting areas and between the floating gates and write paths, with the tunnel openings in each array column being of a same size and the tunnel openings in each array row being of different sizes; and
   a read path coupled to the M floating gates and operable to detect a programmed write path if the tunnel openings formed over the programmed write path are of sufficient size to successfully couple the M floating gates to the programmed write path.

6. A test structure on a semiconductor wafer for testing the sufficiency of tunnel opening sizes in a non-volatile memory cell, comprising:
   a plurality of individually programmable write paths aligned substantially in parallel;
   a plurality of floating gates aligned substantially In parallel and intersecting each of the write paths;
   an array of tunnel openings formed between the Intersections of the write paths and floating gates, with the tunnel openings corresponding to a same write path being of a same size and with tunnel openings corresponding to different write paths being of different sizes; and
   a read path coupled to the floating gates and operable to detect a programmed write path if the tunnel openings corresponding to the programmed write path are of sufficient size to successfully couple the floating gates to the programmed write path.

* * * * *